US009762197B2

(12) United States Patent
Asao et al.

(10) Patent No.: US 9,762,197 B2
(45) Date of Patent: Sep. 12, 2017

(54) MUSIC REPRODUCING DEVICE WITH ACTIVE CONTROL GROUND MODE (71) Applicant: Onkyo Corporation, Osaka (JP)

(72) Inventors: Kei Asao, Osaka (JP); Tsuyoshi Kawaguchi, Osaka (JP); Makoto Yoshida, Osaka (JP); Takanori Shiozaki, Osaka (JP); Yoshinori Nakanishi, Osaka (JP); Hiroyuki Asahara, Osaka (JP); Norimasa Kitagawa, Osaka (JP)

(73) Assignee: ONKYO Corporation, Neyegawa-shi (JP)

( * ) Notice: Subject to any disclaimer, the term of this patent is extended or adjusted under 35 U.S.C. 154(b) by 0 days.

(21) Appl. No.: 15/238,644

(22) Filed: Aug. 16, 2016

(65) Prior Publication Data
US 2017/0063320 A1 Mar. 2, 2017

(30) Foreign Application Priority Data

Sep. 1, 2015 (JP) .................. 2015-171946

(51) Int. Cl.
H04R 5/04 (2006.01)
H03G 3/34 (2006.01)
H03F 3/183 (2006.01)
H03M 1/66 (2006.01)
H03F 1/26 (2006.01)
(Continued)

(52) U.S. Cl.
CPC ............... *H03G 3/341* (2013.01); *H03F 1/26* (2013.01); *H03F 3/183* (2013.01); *H03F 3/187* (2013.01); *H03F 3/45475* (2013.01); *H03F 3/72* (2013.01); *H03M 1/66* (2013.01); *H04R 5/04* (2013.01); *H03F 2200/03* (2013.01)

(58) Field of Classification Search
CPC .......... H03G 3/348; H03G 3/341; H03G 3/34; H03G 3/26; H03F 3/183; H04R 5/04; H03M 1/66
USPC ........................................... 381/74
See application file for complete search history.

(56) References Cited

FOREIGN PATENT DOCUMENTS

JP    2005-130061   *  5/2005   ............. H03F 3/217
JP    2005-130061 A    5/2005
(Continued)

OTHER PUBLICATIONS

Decision to Grant for corresponding Japanese Application No. 2015-171946, dated Jan. 10, 2017, and English translation.
(Continued)

*Primary Examiner* — Md S Elahee
*Assistant Examiner* — Sabrina Diaz
(74) *Attorney, Agent, or Firm* — Renner Otto Boisselle & Sklar, LLP (57) ABSTRACT To realize active control ground that sets inverted output of an amplification circuit to ground with simple configuration. A DAP 1 comprises a positive side DAC 7 that D/A-converts digital audio data into analog audio data, a positive side amplification circuit 9 that amplifies the analog audio data that the DAC 7 D/A-converts, a negative side DAC 8 that D/A-converts the digital audio data into the analog audio data, and a negative side amplification circuit 10 that amplifies the analog audio data that the DAC 8 D/A-converts, and a CPU 2. The CPU 2 mutes the DAC 8 in case of an ACG mode that sets output of the amplification circuit 10 to ground.

2 Claims, 6 Drawing Sheets (51) Int. Cl.
    *H03F 3/187*     (2006.01)
    *H03F 3/45*     (2006.01)
    *H03F 3/72*     (2006.01)

(56) References Cited

FOREIGN PATENT DOCUMENTS

| | | |
|---|---|---|
| JP | 2007-097039 A | 4/2007 |
| JP | 2008-306593 A | 12/2008 |
| JP | 2013-005291 * | 1/2013 ............. H03H 11/32 |

OTHER PUBLICATIONS

Texas Instruments; "Low-Power Stereo Audio Codec for Portable Audio/Telephony"; Feb. 2007—Revised Dec. 2008; www.ti.com.

Eric Gaalaas; "Class D Audio Amplifiers What, Why and How"; Analog Dialogue 40-06, Jun. 2006; http://www.analog.com/analogdialogue.

life.augmented; "25W + 25W dual BTL class-D audio amplifier"; Feb. 2014; DocID15068 Rev. 6.

\* cited by examiner

MUSIC REPRODUCING DEVICE WITH ACTIVE CONTROL GROUND MODE

BACKGROUND OF THE INVENTION

1. Field of the Invention

The present invention relates to a music reproducing device that outputs an audio signal to a headphone.

2. Description of the Related Art

In a headphone output of a music reproducing device that an audio signal to a headphone, there are systems that are called unbalanced and balanced (for example, see JP 2013-005291 A). In an unbalanced system, a three-pole terminal with a diameter of 3.5 mm is used, and an audio signal is transmitted by two kinds of "hot" and "cold". Meanwhile, in a balanced system, a four-pole terminal with a diameter of 2.5 mm is used, and a signal is transmitted by three kinds of "ground", "hot" and "cold". "Cold" is opposite phase of "hot". In case that external noise occurs, noise of the same phase is superposed on both "cold" and "hot". By inverting phase of "cold" and mixing inverted "cold" signal with "hot" signal, external noise is cancelled and amplitude of the audio signal becomes twice. For this reason, the balanced system is strong against noise and sound quality is good in the balanced system.

In the music reproducing device having a balanced output, sound quality effect that is different from an unbalanced output of general ground earth is obtained by setting negative (inverted) output of a BTL amplification to ground (=reference potential). Herein, this system is called active control ground (hereinafter, referred as to "ACG"). For example, the ACG can be realized by analog technique that negative side of a balance input terminal is short to ground.

As a digital music reproducing device, a USB DAC "UD-503" made by TEAC CORPORATION has an ACG mode. "UD-503" is dual monaural circuit configuration from a power source section to a digital section and an analog section. Three ways of following may be thought to realize the ACG mode in this configuration.

Figure 5:
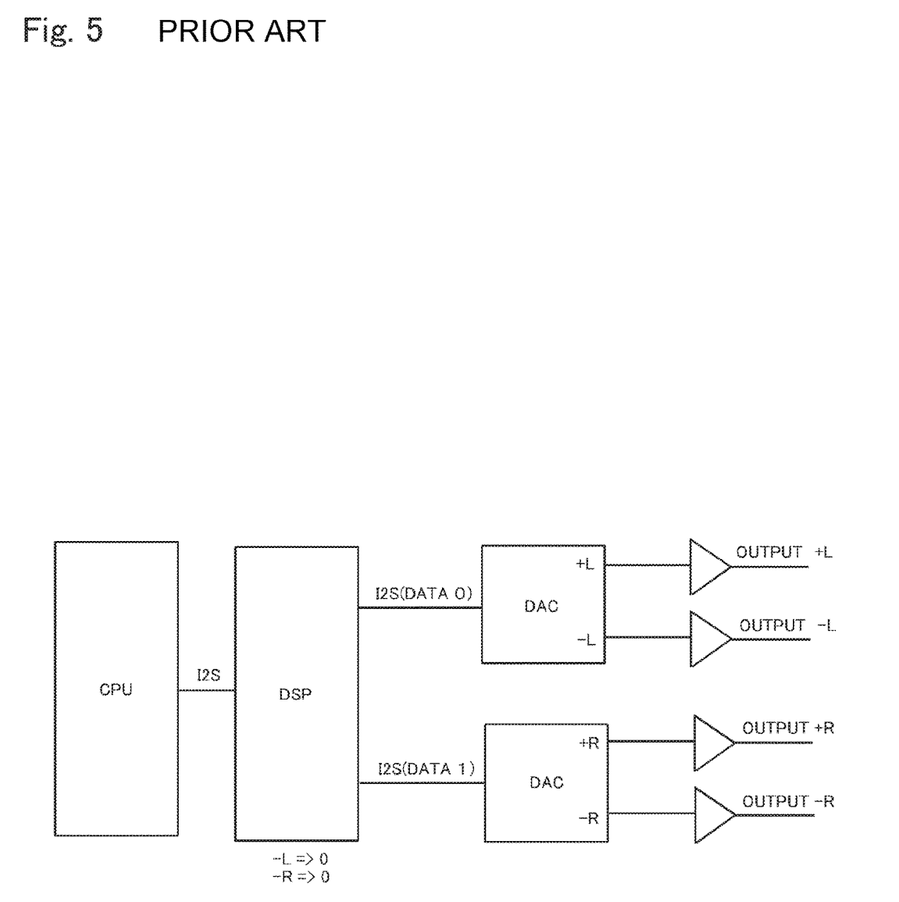
FIG. 5 is a diagram for describing realization method of conventional active control ground.
Figure 6:
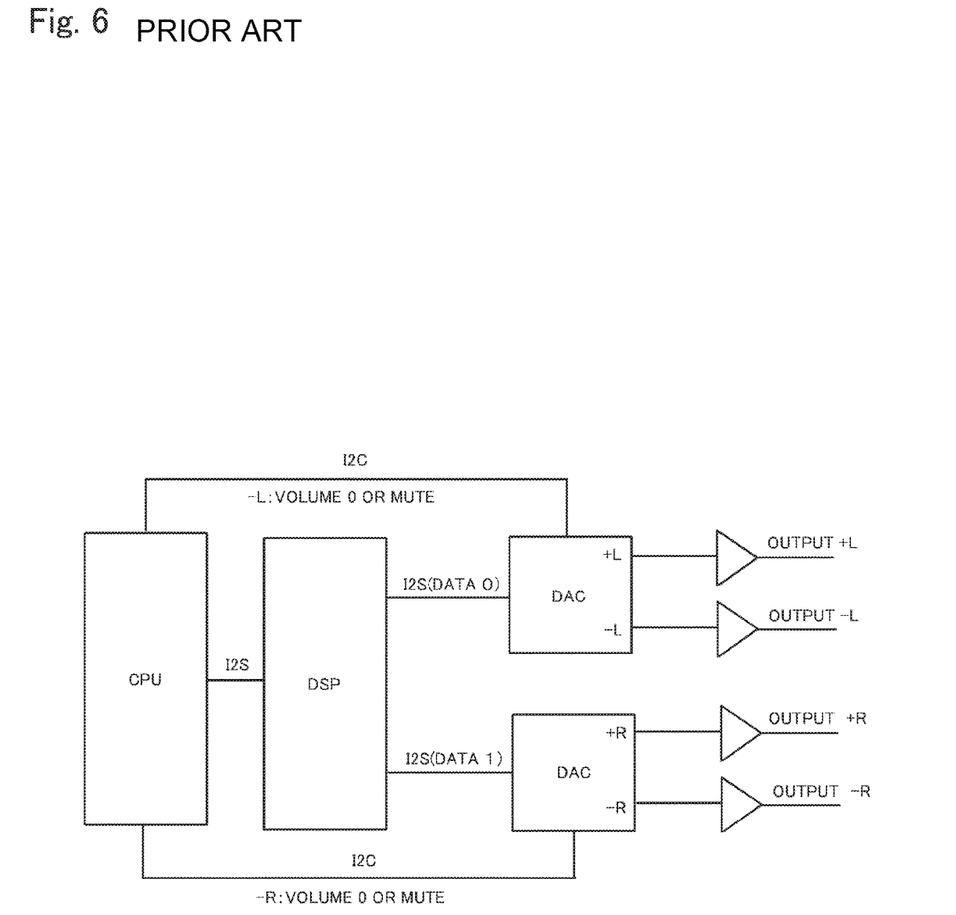
FIG. 6 is a diagram for describing realization method of conventional active control ground.

(1) Negative side input of each of channels is short to ground electrically.
(2) As illustrated in FIG. 5, zero data is inserted to an input signal of each of channels of DACs (D/A converters). The input signal is input to the DACs. In FIG. 5, a normal LR 2 channels audio signal (I2S system) is input from a CPU to a DSP. The DSP sets each of −L channel data and −R channel data to the zero data and inputs the −L channel data and the −R channel data to an amplification circuit. I2S (data 0) illustrated in FIG. 5 is a 2 channels signal of +L channel and −L channel. The −L channel signal is zero data. I2S (data 1) is a 2 channels signal of +R channel and −R channel. The −R channel signal is the zero data.
(3) As illustrated in FIG. 6, negative side volume of each of channels of the DACs is set to zero or is muted. In FIG. 6, a normal LR 2 channels audio signal is input from the CPU to the DSP. I2S (data 0) illustrated in FIG. 6 is a 2 channels signal of +L channel and −L channel. Further, I2S (data 1) is a 2 channels signal of +R channel and −R channel. The CPU sets negative side volume of the DACs to zero or mutes negative side volume of the DACs by I2C.

However, in above (1) to (3), there are following demerits. (1) A circuit for shorting input, a control circuit, a control signal, and a mute function for preventing pop noise are needed. (2) Volume processing by the DSP is needed for an LR 2 channels. (3) Volume operation or mute operation of DAC by I2C from the CPU is needed for 2 channels.

SUMMARY OF THE INVENTION

An objective of the present invention is to realize active control ground that sets inverted output of an amplification circuit to ground with simple configuration.

A music reproducing device comprising: a first D/A converter that D/A-converts a digital audio signal into an analog audio signal for a non-inverted signal; a first amplification circuit that amplifies the analog audio signal that the first D/A converter D/A-converts for a non-inverted signal; a second D/A converter that D/A-converts the digital audio signal into the analog audio signal for an inverted signal; a second amplification circuit that amplifies the analog audio signal that the second D/A converter D/A-converts for an inverted signal; and a controller, wherein the controller mutes the second D/A converter in case of an active control ground mode that sets output of the second amplification circuit to ground.

In the present invention, a controller mutes a second D/A converter in case of an active control ground mode that sets output of the second amplification circuit to ground. Therefore, output of the second amplification circuit becomes ground because the second D/A converter outputs zero data to the second amplification circuit. Herein, it is only necessary that the controller mutes the second D/A converter together (only one signal). Therefore, according to the present invention, active control ground can be realized with simple configuration.

A music reproducing device comprising: a first D/A converter that D/A-converts a digital audio signal into an analog audio signal for a non-inverted signal; a first amplification circuit that amplifies the analog audio signal that the first D/A converter D/A-converts for a non-inverted signal; a second D/A converter that D/A-converts the digital audio signal into the analog audio signal for an inverted signal; a second amplification circuit that amplifies the analog audio signal that the second D/A converter D/A-converts for an inverted signal; and a controller, wherein the controller sets volume of the second D/A converter to zero in case of an active control ground mode that sets output of the second amplification circuit to ground.

In the present invention, a controller sets volume of a second D/A converter to zero in case of an active control ground mode that sets output of the second amplification circuit to ground. Therefore, output of the second amplification circuit becomes ground because the second D/A converter outputs zero data to the second amplification circuit. Herein, it is only necessary that the controller sets volume of the second D/A converter to zero together (only one signal). Therefore, according to the present invention, active control ground can be realized with simple configuration.

According to the present invention, active control ground can be realized with simple configuration.

DETAILED DESCRIPTION OF THE PREFERRED EMBODIMENTS

Figure 1:
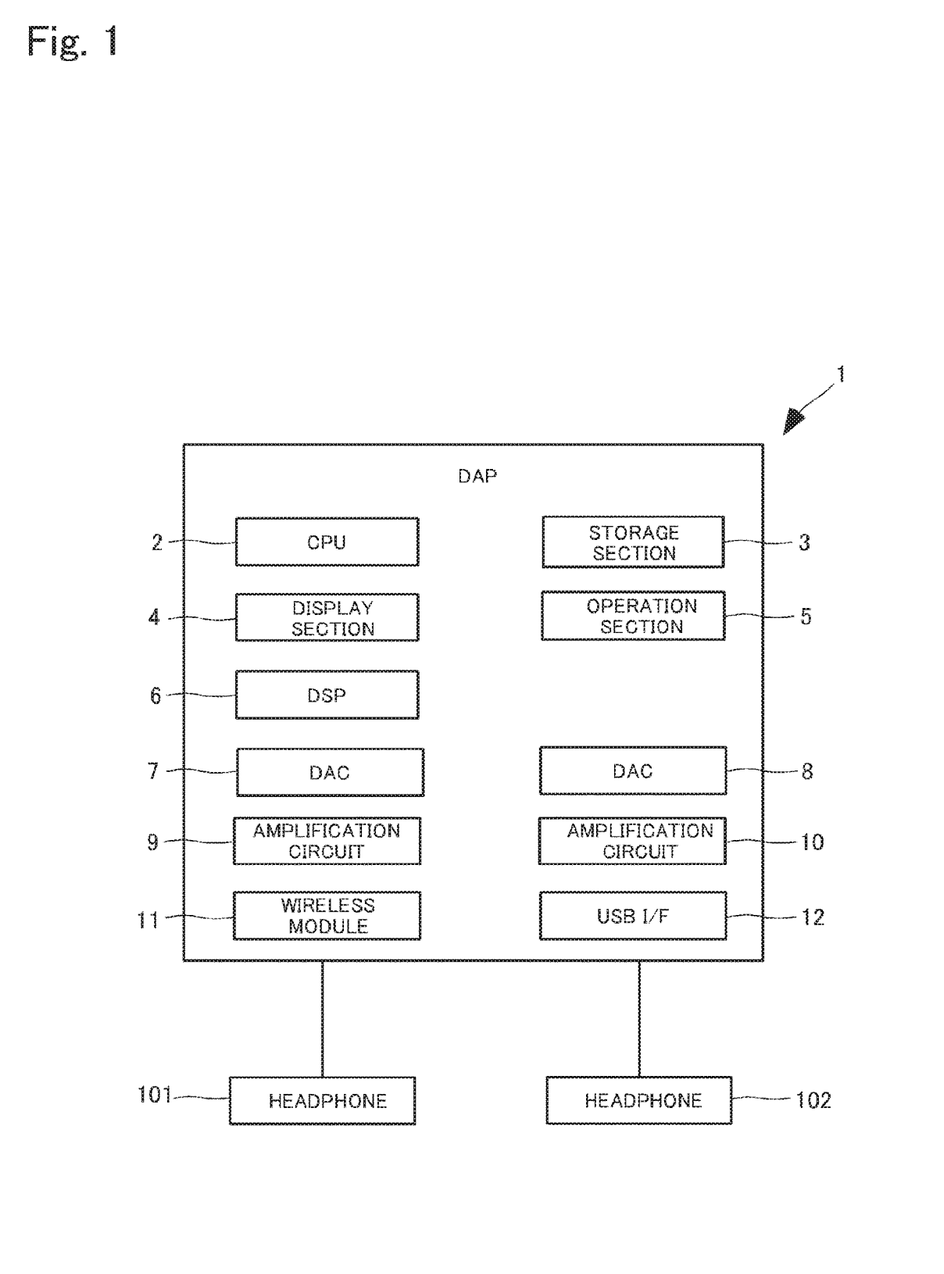
FIG. 1 is a block diagram illustrating a constitution of a digital audio player according to an embodiment of the present invention.

An embodiment of the present invention is described below. FIG. 1 is a block diagram illustrating a constitution of a digital audio player (hereinafter, referred as to "DAP") according to an embodiment of the present invention. The DAP 1 (music reproducing device) outputs analog audio data (analog audio signal) to headphones 101 and 102. Each of headphones 101 and 102 outputs an audio to external based on the analog audio data. The headphone 101 is a headphone for balanced and is connected to a balanced output terminal. The headphone 102 is a headphone for unbalanced and is connected to an unbalanced output terminal. The DAP 1 has a balanced output and an unbalanced output.

As illustrated in FIG. 1, the DAP 1 includes a CPU 2, a storage section 3, a display section 4, an operation section 5, a DSP 6, D/A converters (hereinafter, referred as to "DAC") 7 and 8, amplification circuits 9 and 10, a wireless module 11, and a USB interface (hereinafter, referred as to "USB I/F") 12.

The CPU (Central Processing Unit) 2 (controller) controls respective sections composing the DAP 1 according to a control program, an OS program or application programs. The storage section 3 is composed of a RAM (Random Access Memory) that functions as a main memory of the CPU 2, a ROM (Read Only Memory) for storing the control program and a flash memory for storing programs such as the OS program and the application programs, and various data such as digital audio data. The storage section 3 is not limited to the illustrated constitution, and may include an HDD (Hard Disk Drive).

The display section 4 displays various images (including pictures and movies), and is composed of a liquid crystal panel. The operation section 5 has operation keys for performing various settings, and a touch panel that is linked with the display section 4. A user can input various characters and perform setting via the operation section 5.

The DSP (Digital Signal Processor) 6 performs signal processing such as equalizing to the digital audio data. Each of the DACs 7 and 8 D/A-converts the digital audio data into the analog audio data. Each of the amplification circuits 9 and 10 amplifies the analog audio data that each of DACs 7 and 8 D/A-converts and outputs amplified analog audio data to the headphone 101 or the headphone 102. Detail of the DACs 7 and 8 and the amplification circuits 9 and 10 is described latterly. The wireless module 11 is for performing wireless communication according to Bluetooth (registered trademark) standard and Wi-Fi standard. The USB I/F 12 is for performing communication according to USB standard.

The DAP 1 has a balanced mode and an active control ground (hereinafter, referred as to "ACG") mode that sets output of the negative side amplification circuit 9 (for inverted signal) to ground.

Figure 2:
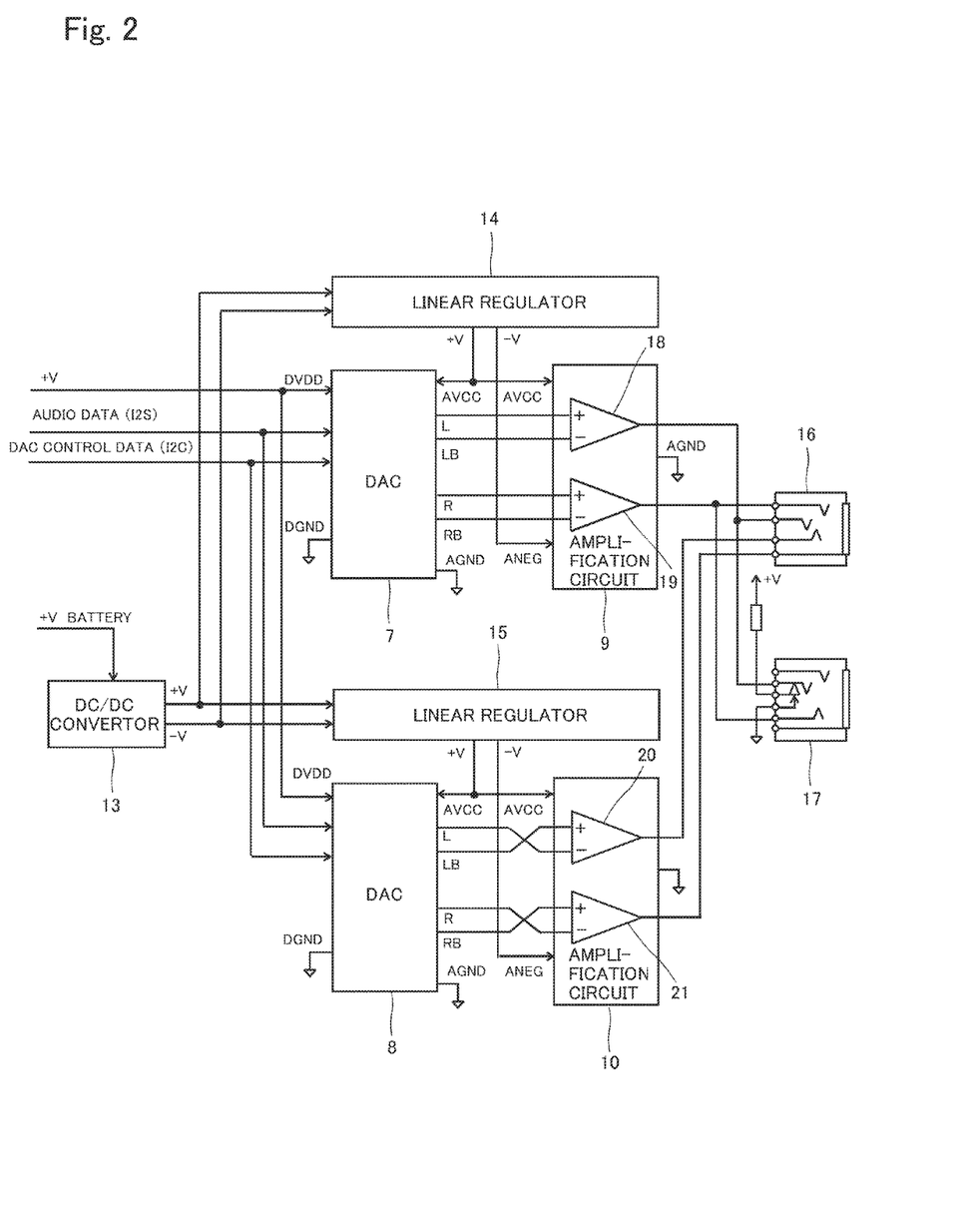
FIG. 2 is a diagram illustrating DACs, amplification circuits, and peripheral circuits of these.

FIG. 2 is a diagram illustrating the DACs 7 and 8, the amplification circuits 9 and 10, and peripheral circuits of these. As illustrated in FIG. 2, the DAP 1 further includes a DC/DC converter 13, and linear regulators 14 and 15. The DC/DC converter 13 boosts voltage that is supplied from a battery and supplies boosted voltage to the linear regulators 14 and 15. The linear regulator 14 supplies power source voltage to the DAC 7 (first D/A converter) and the amplification circuit 9 (first amplification circuit). The linear regulator 15 supplies power source voltage to the DAC 8 (second D/A converter) and the amplification circuit 10 (second amplification circuit). Each of the linear regulators 14 and 15 reduces voltage from the DC/DC converter 13 and supplies reduced voltage to each circuit.

LR (left and right) 2 channels digital audio data (digital audio signal) with I2S system is input to the positive side DAC 7 (for non-inverted signal). The DAC 7 converts the LR 2 channels digital audio data into LR 2 channels analog audio data (analog audio signal). The positive side amplification circuit 9 (for non-inverted signal) amplifies the LR 2 channels analog audio data that the DAC 7 D/A-converts. The amplification circuit 9 includes two amplifiers 18 and 19. The amplifier 18 amplifies L channel analog audio data. The amplifier 19 amplifies R channel analog audio data. The analog audio data that the amplification circuit 9 amplifies is output to a balanced output terminal 16 and an unbalanced output terminal 17.

LR 2 channels digital audio data with I2S system is input to the negative side DAC 8 (for inverted signal). The DAC 8 D/A-converts the LR 2 channels digital audio data into the LR 2 channels analog audio data. Inverted LR 2 channels analog audio data that the LR analog audio data that the DAC 8 D/A-converts is inverted is input to the negative side amplification circuit 10 (for inverted signal). The amplification circuit 10 amplifies the inverted LR 2 channels analog audio data. The amplification circuit 10 includes two amplifiers 20 and 21. The amplifier 20 amplifies inverted L channel analog audio data. The amplifier 21 amplifies inverted R channel analog audio data. The inverted analog audio data that the amplification circuit 10 amplifies is output to the balance output terminal 16.

Figure 3:
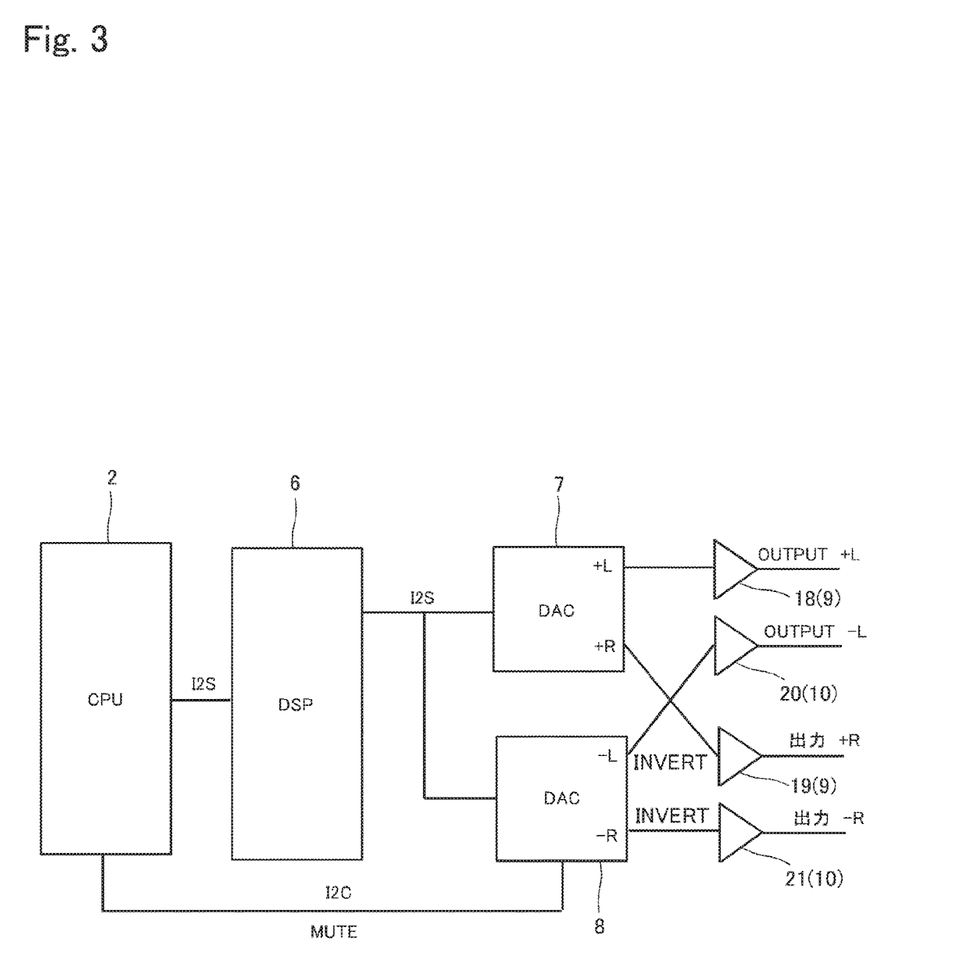
FIG. 3 is a diagram for describing realization method of active control ground.

In the ACG mode, as illustrated in FIG. 3, the CPU 2 mutes the DAC 8 by I2C. Therefore, the DAC 8 outputs zero data to the amplification circuit 10. For this reason, output of the amplification circuit 10 becomes ground (=reference potential). Normal 2 channels digital audio data is input from the CPU 2 to the DSP 6. The normal 2 channels digital audio data is input from the DSP 6 to the DACs 7 and 8.

In the present embodiment, as described above, the CPU 2 mutes the DAC 8 in case of the ACG mode that sets output of the negative side amplification circuit 10 to ground. Therefore, output of the amplification circuit 10 becomes ground because the DAC 8 outputs the zero data to the amplification circuit 10. Herein, it is only necessary that the CPU 2 mutes the DAC 8 together (only one signal). Therefore, according to the present embodiment, ACG can be realized with simple configuration.

The embodiment of the present invention is described above, but the mode to which the present invention is applicable is not limited to the above embodiment and can be suitably varied without departing from the scope of the present invention.

Figure 4:
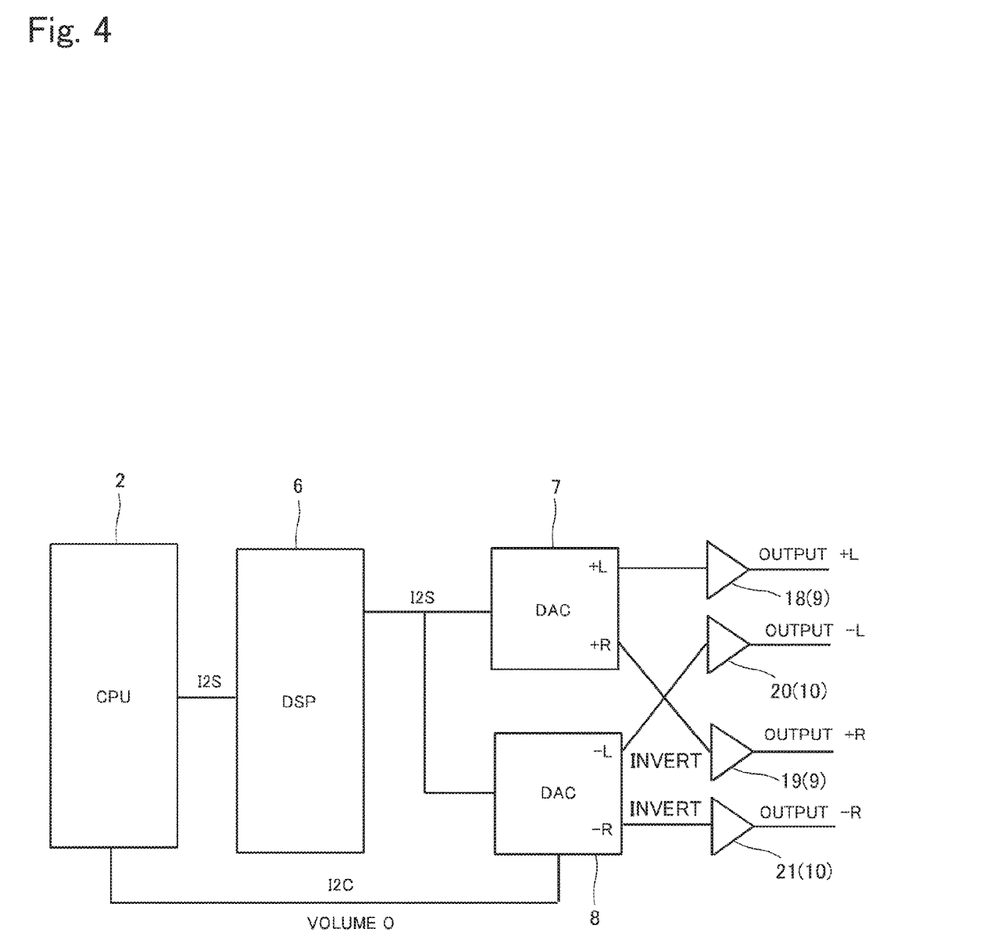
FIG. 4 is a diagram for describing realization method of active control ground.

In the above embodiment, the CPU 2 mutes the DAC 8 in case of the ACG mode. In place of this, as illustrated in FIG. 4, the CPU 2 may set volume of the DAC 8 to zero. In this case, the DAC 8 also outputs the zero data to the amplification circuit 10. For this reason, output of the amplification circuit 10 becomes ground (=reference potential).

The above embodiment describes a DAP as a music reproducing device. Not limited to this, the music reproducing device may be a smartphone, a tablet PC, a USB DAC.

The present invention can be suitably employed in a music reproducing device that outputs audio signal to a headphone.

What is claimed is:

1. A music reproducing device comprising: a first D/A converter that D/A-converts a digital audio signal into an analog audio signal for a non-inverted signal;
a first amplification circuit that amplifies the analog audio signal that the first D/A converter D/A-converts for a non-inverted signal;
a second D/A converter that D/A-converts the digital audio signal into an analog audio signal for an inverted signal;
a second amplification circuit that amplifies the analog audio signal that the second D/A converter D/A-converts for an inverted signal; and
a controller, wherein
the controller mutes the second D/A converter in case of an active control ground mode that sets output of the second amplification circuit to ground.

2. A music reproducing device comprising: a first D/A converter that D/A-converts a digital audio signal into an analog audio signal for a non-inverted signal;
a first amplification circuit that amplifies the analog audio signal that the first D/A converter D/A-converts for a non-inverted signal;
a second D/A converter that D/A-converts the digital audio signal into an analog audio signal for an inverted signal;
a second amplification circuit that amplifies the analog audio signal that the second D/A converter D/A-converts for an inverted signal; and
a controller, wherein
the controller sets volume of the second D/A converter to zero in case of an active control ground mode that sets output of the second amplification circuit to ground.

* * * * *